(12) United States Patent
Nunotani et al.

(10) Patent No.: US 8,816,378 B2
(45) Date of Patent: Aug. 26, 2014

(54) LIGHT EMITTING ELEMENT AND METHOD FOR MANUFACTURING SAME

(71) Applicant: Kabushiki Kaisha Toshiba, Tokyo (JP)

(72) Inventors: Shinji Nunotani, Tokyo (JP); Yasuhiko Akaike, Kanagawa-ken (JP); Kayo Inoue, Fukuoka-ken (JP); Katsufumi Kondo, Fukuoka-ken (JP); Tokuhiko Matsunaga, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/929,465

(22) Filed: Jun. 27, 2013

(65) Prior Publication Data

US 2013/0292729 A1    Nov. 7, 2013

Related U.S. Application Data

(63) Continuation of application No. PCT/JP2011/065299, filed on Jul. 4, 2011.

(30) Foreign Application Priority Data

Dec. 27, 2010  (JP) ................................. 2010-290135

(51) Int. Cl.
*H01L 33/42* (2010.01)
*H01L 33/40* (2010.01)

(52) U.S. Cl.
USPC .................. 257/98; 257/91; 257/103; 438/22

(58) Field of Classification Search
CPC ....... H01L 33/38; H01L 33/48; H01L 33/405; H01L 33/14; H01L 33/387; H01L 33/0079
See application file for complete search history.

(56) References Cited

U.S. PATENT DOCUMENTS

| 6,784,462 B2 | 8/2004 | Schubert |
| 2003/0111667 A1 | 6/2003 | Schubert |
| 2003/0141506 A1 | 7/2003 | Sano et al. |
| 2004/0104390 A1 | 6/2004 | Sano et al. |
| 2005/0035364 A1 | 2/2005 | Sano et al. |
| 2005/0211993 A1 | 9/2005 | Sano et al. |

(Continued)

FOREIGN PATENT DOCUMENTS

| JP | 2005-197296 A | 7/2005 |
| JP | 2006032665 A | 2/2006 |

(Continued)

OTHER PUBLICATIONS

Form PCT/ISA/210 (Japanese).

(Continued)

*Primary Examiner* — Matthew W Such
*Assistant Examiner* — David Spalla
(74) *Attorney, Agent, or Firm* — White & Case LLP (57) ABSTRACT

According to one embodiment, a light emitting element, includes: a semiconductor stacked body including a light emitting layer; a first upper electrode being connected directly to the semiconductor stacked body; at least one second upper electrode extending from the first upper electrode, the at least one second upper electrode being connected to the semiconductor stacked body via a first contact layer; a lower electrode; a transparent conductive layer; an intermediate film containing oxygen provided between the semiconductor stacked body and the transparent conductive layer; a light reflecting layer; and a current-blocking layer, at least one slit being provided selectively in the current-blocking layer as viewed from a direction perpendicular to a major surface of the light emitting layer.

18 Claims, 8 Drawing Sheets

(56) References Cited

U.S. PATENT DOCUMENTS

2009/0072257 A1    3/2009   Unno et al.
2010/0219436 A1    9/2010   Watanabe
2010/0224898 A1    9/2010   Kazama

FOREIGN PATENT DOCUMENTS

| | | |
|---|---|---|
| JP | 2007-335757 A | 12/2007 |
| JP | 2010-232263 A | 10/2010 |
| JP | 2010-263050 A | 11/2010 |
| WO | 2012/090534 A1 | 7/2012 |

OTHER PUBLICATIONS

Form PCT/ISA/220 (Japanese).
Form PCT/ISA/237 (Japanese).
Japanese Office Action issued on Jan. 31, 2013 in the counterpart Japanese patent application No. 2010-290135 and an English translation thereof.

LIGHT EMITTING ELEMENT AND METHOD FOR MANUFACTURING SAME

CROSS-REFERENCE TO RELATED APPLICATIONS

This is a continuation application of International Application PCT/JP2011/065299, filed on Jul. 4, 2011; the entire contents of which are incorporated herein by reference. This application also claims priority to Japanese Application No. 2010-290135, filed on Dec. 27, 2010; the entire contents of which are incorporated herein by reference.

FIELD

Embodiments described herein relate generally to a light emitting element and a method for manufacturing the same.

BACKGROUND

A metal film may be used as a reflective material in a light emitting element, e.g., an LED (Light Emitting Diode) element. The characteristics of the reflective material greatly affect the characteristics of the LED element. To ensure the electrical connection with the semiconductor layer, for example, a gold (Au) alloy including zinc (Zn) may be used as the metal film in the case where the semiconductor layer is a p-type semiconductor layer; and a Au alloy including germanium (Ge) may be used in the case of an n-type semiconductor layer. However, an alloy layer forms between the semiconductor layer and the metal when heat treatment is performed to ensure the electrical connection between the Au alloy and the semiconductor layer. The alloy layer causes the reflectance to decrease by absorbing the light. To avoid this problem, a method may be considered in which the alloy layer is prevented from forming by interposing a transparent electrode of indium tin oxide (ITO), etc., between the Au alloy and the semiconductor layer.

On the other hand, it is desirable for the current not to flow under the pad electrode which is the upper electrode of the LED as much as possible because the pad electrode blocks the light that is emitted by the active layer. Methods to this end include, for example, a method in which a blocking layer that blocks the current flowing between the upper and lower electrodes is provided under the upper electrode, and a method in which a lower confinement layer that constrains the current connection locations is provided under the upper electrode. However, to further increase the luminance of the LED element, there is room for improvement in such methods.

BRIEF DESCRIPTION OF THE DRAWINGS

FIGS. 4A to 5B are schematic cross-sectional views of main components showing manufacturing processes of the light emitting element;

DETAILED DESCRIPTION

In general, according to one embodiment, a light emitting element, includes: a semiconductor stacked body including a light emitting layer; a first upper electrode provided on the semiconductor stacked body, the first upper electrode being connected directly to the semiconductor stacked body; at least one second upper electrode extending from the first upper electrode on the semiconductor stacked body, the at least one second upper electrode being connected to the semiconductor stacked body via a first contact layer; a lower electrode provided under the semiconductor stacked body; a transparent conductive layer provided between the semiconductor stacked body and the lower electrode, the transparent conductive layer transmitting light emitted from the light emitting layer; an intermediate film containing oxygen provided between the semiconductor stacked body and the transparent conductive layer; a light reflecting layer provided between the transparent conductive layer and the lower electrode; and a
current-blocking layer provided between the semiconductor stacked body and the transparent conductive layer and between the semiconductor stacked body and a pair of the first upper electrode and the second upper electrode, or between the semiconductor stacked body and the transparent conductive layer or between the semiconductor stacked body and a pair of the first upper electrode and the second upper electrode, at least one slit being provided selectively in the current-blocking layer as viewed from a direction perpendicular to a major surface of the light emitting layer.

According to another embodiment, a method for manufacturing a light emitting element, includes: forming a semiconductor stacked body including a light emitting layer on a semiconductor substrate; forming a current-blocking layer on the semiconductor stacked body, at least one slit being made selectively in the current-blocking layer; forming a transparent conductive layer on the current-blocking layer; forming a first light reflecting layer unit on the transparent conductive layer; bonding a second light reflecting layer unit to the first light reflecting layer unit, the second light reflecting layer unit being provided on a support substrate; removing the semiconductor substrate from the semiconductor stacked body; and forming a first upper electrode directly on the semiconductor stacked body and forming at least one second upper electrode on the semiconductor stacked body being connected to the first upper electrode, the at least one second upper electrode being formed on the semiconductor stacked body via a first contact layer, the slit being made selectively in the current-blocking layer at a periphery of the second upper electrode as viewed from a direction perpendicular to a major surface of the light emitting layer.

Embodiments will now be described with reference to the drawings. In the description hereinbelow, similar members are marked with like reference numerals; and a description is omitted as appropriate for members once described.

First Embodiment

Figure 1:
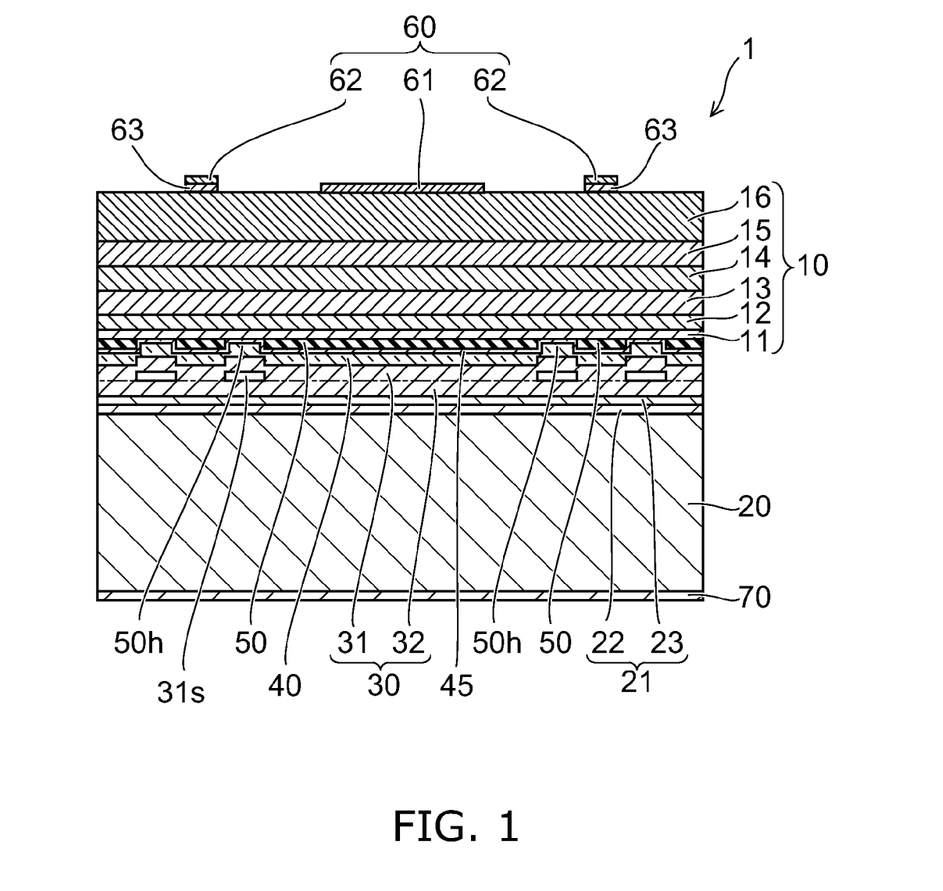
FIG. 1 is a schematic cross-sectional view of main components of a light emitting element according to a first embodiment.

FIG. 1 is a schematic cross-sectional view of main components of a light emitting element according to a first embodiment.

Figure 2:
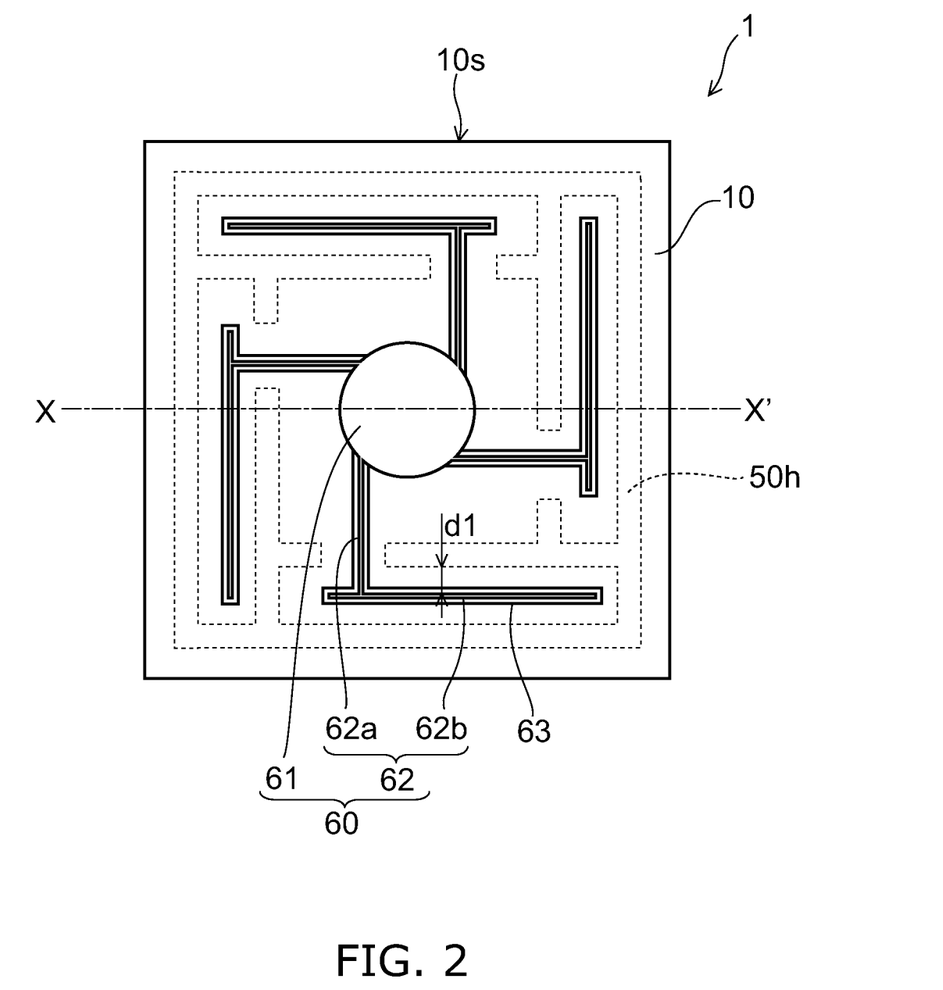
FIG. 2 is a schematic plan view of the main components of the light emitting element according to the first embodiment.

FIG. 2 is a schematic plan view of the main components of the light emitting element according to the first embodiment.

FIG. 1 shows the X-X' cross section of FIG. 2.

The light emitting element 1 according to the first embodiment is a thin-film LED element having a top/bottom electrode structure.

The light emitting element 1 includes a semiconductor stacked body 10, a support substrate 20, a light reflecting layer 30, a transparent conductive layer 40, a current-blocking layer 50, an upper electrode 60, and a lower electrode 70. The semiconductor stacked body 10 includes a light emitting layer (an active layer) 14.

The light emitting layer 14 is formed in a layered configuration and has a first major surface which is the upper surface, and a second major surface which is the lower surface. In the specification, the first major surface side is taken to be the upper side; and the second major surface side is taken to be the lower side. The upper electrode 60 is provided on the semiconductor stacked body 10 on the first major surface side. The lower electrode 70 is provided under the semiconductor stacked body 10 on the second major surface side. The transparent conductive layer 40 is provided between the semiconductor stacked body 10 and the lower electrode 70 on the second major surface side. The transparent conductive layer 40 is a layer that transmits the light emitted from the light emitting layer 14. The light reflecting layer 30 is provided between the transparent conductive layer 40 and the lower electrode 70. The current-blocking layer 50 is provided between the semiconductor stacked body 10 and the transparent conductive layer 40 on the second major surface side.

The semiconductor stacked body 10 includes a p-type contact layer 11, a p-type current diffusion layer 12, a p-type clad layer 13, the light emitting layer 14, an n-type clad layer 15, and an n-type current diffusion layer 16 that are stacked in this order from the support substrate 20 side toward the upper electrode 60 side. The upper electrode 60 side is taken as a first major surface of the light emitting layer 14; and the lower electrode 70 side is taken as a second major surface of the light emitting layer 14. The light emitting layer 14 emits light of a prescribed wavelength when holes recombine with electrons inside the light emitting layer 14. For example, the light emitting layer 14 emits red light. Although the semiconductor layers are stacked in the order of the p-type semiconductor layer and the n-type semiconductor layer from the support substrate 20 side toward the upper electrode 60 side in the example recited above, the embodiment is not limited to this order. For example, a semiconductor stacked body may be used in which the n-type semiconductor layer is provided on the lower side of the light emitting layer 14 and the p-type semiconductor layer is provided on the upper side of the light emitting layer 14.

The main component of the contact layer 11 is GaAs, GaAlAs, GaP, etc. The main component of the current diffusion layer 12, the clad layer 13, the light emitting layer 14, the clad layer 15, and the current diffusion layer 16 is InGaAlP. In the specification, the quaternary "InGaAlP" is a material of the compositional formula $In_x(Ga_yAl_{1-y})_{1-x}P$ ($0 \leq x \leq 1$ and $0 \leq y \leq 1$). The materials of the semiconductor layers include materials to which a p-type impurity or an n-type impurity is added.

The support substrate 20 is a conductive substrate. The material of the support substrate 20 is a semiconductor such as silicon (Si), germanium (Ge), etc., or a metal such as aluminum (Al), copper (Cu), etc. A diffusion prevention layer 21 is provided on the support substrate 20. The diffusion prevention layer 21 is a layer in which a metal film 22 such as titanium (Ti), etc., and a metal film 23 such as platinum (Pt), etc., are stacked in this order from the support substrate 20 side toward the upper electrode 60 side. The diffusion prevention layer 21 is a barrier layer that suppresses the diffusion of the components of the light reflecting layer 30 into the support substrate 20 or suppresses the diffusion of the components of the support substrate 20 into the light reflecting layer 30. The reflectance of the light reflecting layer 30 is ensured by the diffusion prevention layer 21 being provided between the light reflecting layer 30 and the support substrate 20.

The light reflecting layer 30 is provided on the diffusion prevention layer 21. The light reflecting layer 30 is a layer including a first light reflecting layer unit 31 on the semiconductor stacked body 10 side bonded to a second light reflecting layer unit 32 on the support substrate 20 side. A space 31s is provided selectively in the first light reflecting layer unit 31. The space 31s is positioned under a slit 50h described below. The light reflecting layer 30 is made of a metal or a compound of a metal. The slit 50h may be called a trench or a gap.

The transparent conductive layer 40 that transmits the light emitted from the light emitting layer 14 is provided on the light reflecting layer 30. The conductivity and optical transmittance of the transparent conductive layer 40 are higher than those of the layers included in the semiconductor stacked body 10. The material of the transparent conductive layer 40 is, for example, indium tin oxide (ITO). The transparent conductive layer 40 is provided between the light reflecting layer 30 and the semiconductor stacked body 10. An intermediate layer (an intermediate film) 45 that contains at least one selected from oxygen (O) and carbon (C) may be provided at the surface of the transparent conductive layer 40 where the transparent conductive layer 40 contacts the semiconductor stacked body 10; and the intermediate layer 45 may be, for example, silicon dioxide ($SiO_2$).

The intermediate layer 45 is provided between the semiconductor stacked body 10 and the transparent conductive layer 40.

The elemental components of the semiconductor layer and the transparent conductive layer 40 do not mix easily with each other due to the existence of the intermediate layer 45. Therefore, an alloy layer (a mixed-component layer) such as a conventional ohmic junction does not form easily on the semiconductor layer side. In the case where such an alloy layer exists, the alloy layer becomes a light absorption layer and undesirably reduces the luminance of the light emitting element. In the light emitting element 1, the luminance is higher because the alloy layer does not form easily.

The reflectance of the current-blocking layer 50 described below is equivalent to that of the reflective metal under the ohmic junction portion via the slit 50h. Or, the reflectance of the light emitting element 1 at the slit 50h is higher due to the absence of the insulator. Further, good ohmic contact adhesion that is more stable is obtained in the light emitting element 1. As a result, there is no peeling between the semiconductor layer and the transparent conductive layer 40; and the element voltage stabilizes.

The refractive index of the transparent conductive layer 40 is lower than the refractive index of the semiconductor stacked body 10 at the wavelength of the light emitted from the light emitting layer 14. The thickness of the transparent conductive layer 40 is not less than 30 nm (nanometers) and not more than 100 nm. In the case where the thickness of the transparent conductive layer 40 exceeds 100 nm, there is a risk that the light emitted from the light emitting layer 14 may be undesirably absorbed by the transparent conductive layer 40; and the luminance of the light emitting element 1 may decrease. In the case where the thickness of the transparent conductive layer 40 is less than 30 nm, the electrical connectability between the transparent conductive layer 40 and the semiconductor stacked body 10 degrades; and the contact resistance between the transparent conductive layer 40 and the semiconductor stacked body 10 undesirably becomes high. Accordingly, it is desirable for the thickness of the transparent conductive layer 40 to be not less than 30 nm and not more than 100 nm.

The current-blocking layer 50 is provided on the light reflecting layer 30 to suppress the current flowing between the upper electrode 60 and the lower electrode 70. The material of the current-blocking layer 50 is an insulator such as $SiO_2$, $Si_3N_4$, $Al_2O_3$, etc. The refractive index of the current-blocking layer 50 is lower than the refractive index of the semiconductor stacked body 10 at the wavelength of the light emitted from the light emitting layer 14.

The thickness of the current-blocking layer 50 is not more than 100 nm. In the case where the thickness of the current-blocking layer 50 exceeds 100 nm, there is a risk that the light emitted from the light emitting layer 14 may be undesirably absorbed by the current-blocking layer 50; and the luminance of the light emitting element 1 may decrease. Accordingly, it is desirable for the thickness of the current-blocking layer 50 to be not more than 100 nm.

The current-blocking layer 50 selectively has an opening due to the slit 50h. Thereby, the transparent conductive layer 40 is connected to the contact layer 11 via the slit 50h. In other words, an electrical connection is made between the upper electrode 60 and the lower electrode 70 via the slit 50h. The position and planar dimensions of the slit 50h are standardized according to the necessary performance of the light emitting element. When viewed from a direction perpendicular to the first major surface of the light emitting layer 14, the slit 50h may have a linked configuration as shown in FIG. 2, or may have a partially discontinuous configuration. In the case of the partially discontinuous configuration, for example, the slits 50h having relatively short lengths (in the longitudinal direction) are disposed along a second upper electrode unit 62 at the periphery of the second upper electrode unit 62. In such a case, the slits 50h are multiple.

The upper electrode 60 is provided on the semiconductor stacked body 10 on the first major surface side of the light emitting layer 14. The upper electrode 60 includes a first upper electrode unit 61 and at least one second upper electrode unit 62 extending from the first upper electrode unit 61. The planar configuration of the first upper electrode unit 61 is, for example, circular. The first upper electrode unit 61 is a pad electrode connected to the connection terminal of the light emitting element 1. The second upper electrode unit 62 is a fine electrode. The second upper electrode unit 62 is a draw-out electrode. The second upper electrode unit 62 causes the current (the electron current) input to the first upper electrode unit 61 to diffuse from the center of the current diffusion layer 16 to the end of the current diffusion layer 16.

The first upper electrode unit 61 is provided directly on the semiconductor stacked body 10. The first upper electrode unit 61 is connected directly to the semiconductor stacked body 10. A Schottky barrier is formed between the first upper electrode unit 61 and the current diffusion layer 16. Because the Schottky barrier is formed, there is no electrical connection between the first upper electrode unit 61 and the semiconductor stacked body 10; or the current flowing between the first upper electrode unit 61 and the semiconductor stacked body 10 is smaller than the current flowing between the second upper electrode unit 62 and the semiconductor stacked body 10.

On the other hand, a contact layer 63 is interposed between the second upper electrode unit 62 and the semiconductor stacked body 10. There is an electrical connection between the second upper electrode unit 62 and the semiconductor stacked body 10. The material of the contact layer 63 is, for example, GaAs, GaAlAs, etc.

In the specification, the contact layer 63 is taken as a first contact layer; the contact layer 11 is taken as a second contact layer; and a contact layer 17 is taken as a third contact layer.

When the light emitting element 1 is viewed from the direction perpendicular to the first major surface of the light emitting layer 14 (referring to FIG. 2), at least one slit 50h is provided at the periphery of the second upper electrode unit 62. The slit 50h is not provided directly under the upper electrode 60.

The planar configuration of the semiconductor stacked body 10 may be polygonal or circular. For example, the planar configuration of the semiconductor stacked body 10 shown in FIG. 2 is quadrilateral. The second upper electrode unit 62 includes a first electrode unit 62a extending substantially perpendicular from the first upper electrode unit 61 toward the peripheral portion of the plane of the semiconductor stacked body 10, and a second electrode unit 62b connected to the first electrode unit 62a to extend substantially parallel to the outer circumference of the plane of the semiconductor stacked body 10.

For example, in FIG. 2, the second upper electrode unit 62 includes the first electrode unit 62a extending from the first upper electrode unit 61 substantially perpendicular to a side 10s of the polygon, and the second electrode unit 62b connected to the first electrode unit 62a to extend substantially parallel to the side 10s. The ends of the second electrode unit 62b extend to the four corners of the current diffusion layer 16. The slit 50h is provided selectively at the periphery of the second electrode unit 62b.

A distance d1 between the second electrode unit 62b and the slit 50h as viewed from the direction perpendicular to the first major surface of the light emitting layer 14 is not less than 10 μm (micrometers). The distance d1 is the distance between the end of the second electrode unit 62b and the end of the slit 50h that oppose each other as viewed from the direction perpendicular to the first major surface of the light emitting layer 14. In the case where the distance d1 is less than 10 μm, there is a risk that the light emitted from above the slit 50h may be blocked by the second upper electrode unit 62; and the luminance of the light emitting element 1 may decrease. Accordingly, it is desirable for the distance d1 to be not less than 10 μm.

Further, the surface area of a square defined by the length of one side of the square being the width of the slit 50h is not more than 1000 μm² as viewed from the direction perpendicular to the first major surface of the light emitting layer 14. In the case where the surface area exceeds 1000 μm², the current density flowing through the slit 50h undesirably decreases. Therefore, there is a risk that the luminance of the light emitting element 1 may decrease. Accordingly, it is desirable for the surface area described above to be not more than 1000 μm².

Also, a total surface area A (cm²) of the transparent conductive layer 40 where the transparent conductive layer 40 contacts the semiconductor stacked body 10 via the slit 50h is not less than 5% of the surface area of the semiconductor stacked body 10 and not more than 15% of the surface area of the semiconductor stacked body 10 when viewed from the direction perpendicular to the first major surface of the light emitting layer 14.

The total surface area A (cm$^2$) of the transparent conductive layer 40 where the transparent conductive layer 40 contacts the semiconductor stacked body 10 via the slit 50$h$ is represented by Formula (1) recited below.

For example, the contact resistance between the transparent conductive layer 40 and the semiconductor stacked body 10 is $\rho c$ ($\Omega \cdot cm^2$); and the current value through the total surface area A is Ic (A). The voltage between the contact layer 11 and the light reflecting layer 30 is Vc (V); and the permissible voltage at the contact interface between the transparent conductive layer 40 and the semiconductor stacked body 10 is Vmax (V). In such a case, Vc=Ic×($\rho c$/A); Vmax>Vc; and the total surface area A (cm$^2$) is represented by Formula (1).

$$A > Ic \times \rho c / V\max \quad \text{Formula (1)}$$

The first light reflecting layer unit 31 includes at least one element selected from the group consisting of gold (Au), silver (Ag), aluminum (Al), zinc (Zn), zirconium (Zr), silicon (Si), germanium (Ge), platinum (Pt), rhodium (Rh), nickel (Ni), palladium (Pd), copper (Cu), tin (Sn), carbon (C), magnesium (Mg), chrome (Cr), tellurium (Te), selenium (Se), titanium (Ti), oxygen (O), hydrogen (H), tungsten (W), and molybdenum (Mo).

The second light reflecting layer unit 32 is gold (Au) or a gold (Au) alloy, where the gold alloy includes at least one selected from the group consisting of silver (Ag), aluminum (Al), zinc (Zn), zirconium (Zr), silicon (Si), germanium (Ge), platinum (Pt), rhodium (Rh), nickel (Ni), palladium (Pd), copper (Cu), tin (Sn), carbon (C), magnesium (Mg), chrome (Cr), tellurium (Te), selenium (Se), titanium (Ti), oxygen (O), hydrogen (H), tungsten (W), and molybdenum (Mo).

The second light reflecting layer unit 32 may be multilayered. In such a case, each layer of the multiple layers includes at least one element selected from the group consisting of gold (Au), silver (Ag), aluminum (Al), zinc (Zn), zirconium (Zr), silicon (Si), germanium (Ge), platinum (Pt), rhodium (Rh), nickel (Ni), palladium (Pd), copper (Cu), tin (Sn), carbon (C), magnesium (Mg), chrome (Cr), tellurium (Te), selenium (Se), titanium (Ti), oxygen (O), hydrogen (H), tungsten (W), and molybdenum (Mo).

To improve the thermal stability and chemical resistance of the light reflecting layer 30, it is desirable to use the alloy described above as the material of the light reflecting layer 30.

Effects of the light emitting element 1 will now be described.

Before describing the effects of the light emitting element 1, the effects of a light emitting element 100 according to a reference example will be described.

Figure 3A:
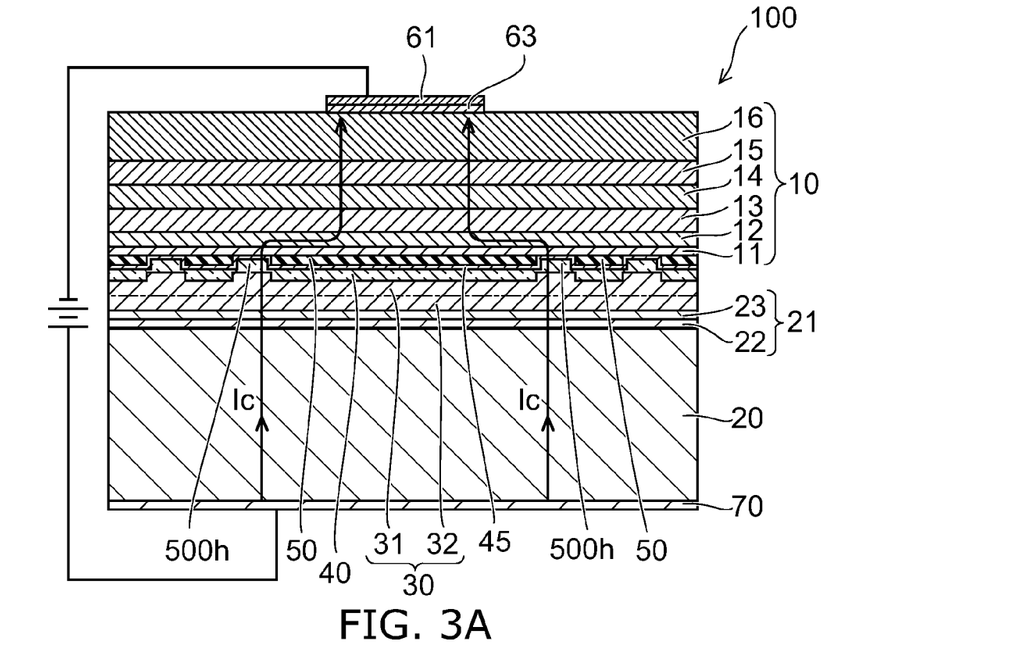
FIG. 3A is a schematic cross-sectional view of main components of a light emitting element according to a reference example and FIG. 3B is a schematic cross-sectional view of main components of the light emitting element of the first embodiment.
Figure 3B:
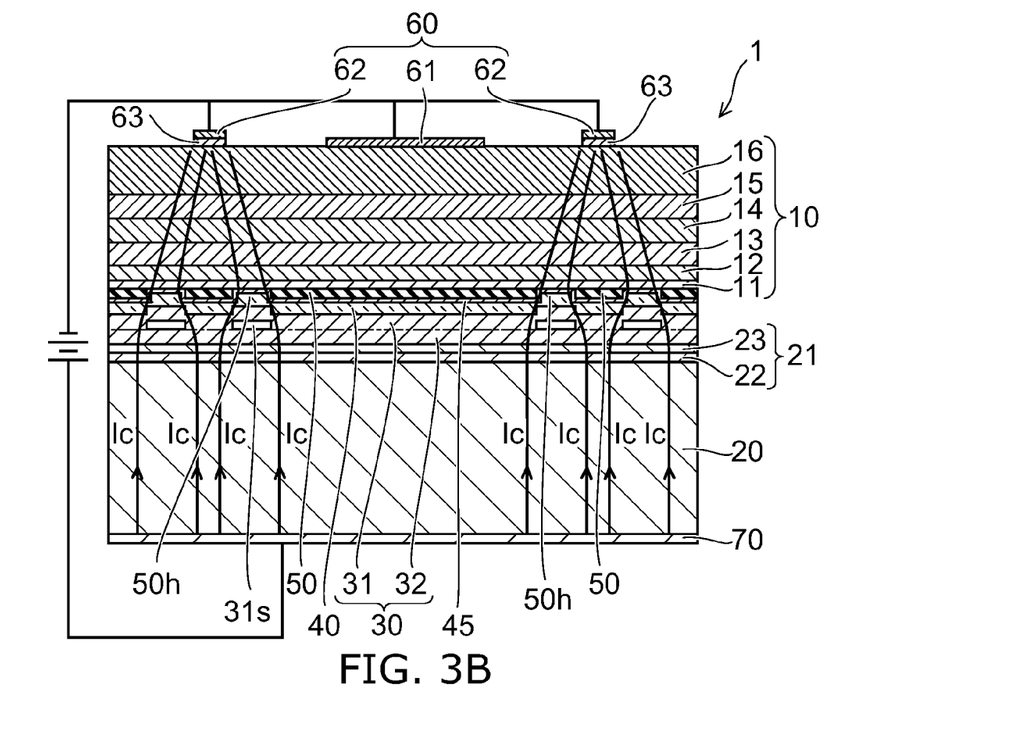

FIGS. 3A and 3B show the effects of the light emitting elements. FIG. 3A is a schematic cross-sectional view of main components of the light emitting element according to the reference example; and FIG. 3B is a schematic cross-sectional view of main components of the light emitting element of the first embodiment.

The second upper electrode unit 62 described above is not provided in the light emitting element 100 according to the reference example shown in FIG. 3A. In the light emitting element 100, only the first upper electrode unit 61 is provided on the semiconductor stacked body 10 with the contact layer 63 interposed.

When a voltage is applied between the first upper electrode unit 61 and the lower electrode 70 in the light emitting element 100, the electrons and the holes injected into the light emitting layer 14 recombine; and the light emitting layer 14 emits light of a prescribed wavelength.

However, the resistivity of the compound semiconductor included in the semiconductor stacked body 10 is relatively high. Further, the first upper electrode unit 61 has a flat plate configuration; and the electric field undesirably concentrates at the edge of the first upper electrode unit 61. Therefore, the current Ic flowing between the first upper electrode unit 61 and the lower electrode 70 undesirably flows preferentially through an opening 500$h$ that is proximal to the first upper electrode unit 61. For example, the current Ic is as the arrows Ic shown in FIG. 3A.

The current Ic concentrates at the opening 500$h$ that is proximal to the first upper electrode unit 61. As a result, in the light emitting element 100, there is a possibility that the light emitting portion of the light emitting layer 14 may become localized; and a high luminance may not be obtained.

Conversely, in the light emitting element 1, the upper electrode 60 includes the first upper electrode unit 61 and the second upper electrode unit 62. There is no electrical connection between the first upper electrode unit 61 and the semiconductor stacked body 10; and there is an electrical connection between the second upper electrode unit 62 and the semiconductor stacked body 10. Further, the slit 50$h$ is provided at the periphery of the second upper electrode unit 62 when the light emitting element 1 is viewed from above.

In the light emitting element 1, when the voltage is applied between the first upper electrode unit 61 and the lower electrode 70, the current Ic does not flow between the first upper electrode unit 61 and the lower electrode 70 but flows through the slit 50$h$ between the lower electrode 70 and the second upper electrode unit 62 that extends in the plane of the semiconductor stacked body 10.

The slit 50$h$ is provided at the periphery of the second upper electrode unit 62 but not directly under the second upper electrode unit 62. Therefore, the current Ic flowing inside the light emitting element 1 is diffused as in the arrows Ic shown in FIG. 3B. Accordingly, localized current concentration such as that of the light emitting element 100 does not occur easily in the light emitting element 1. Further, the current density flowing through the slit 50$h$ increases. Accordingly, in the light emitting element 1, the high-density current Ic is efficiently dispersed; and a luminance that is higher than that of the light emitting element 100 is obtained.

A method for manufacturing the light emitting element 1 will now be described.

Figure 4A:
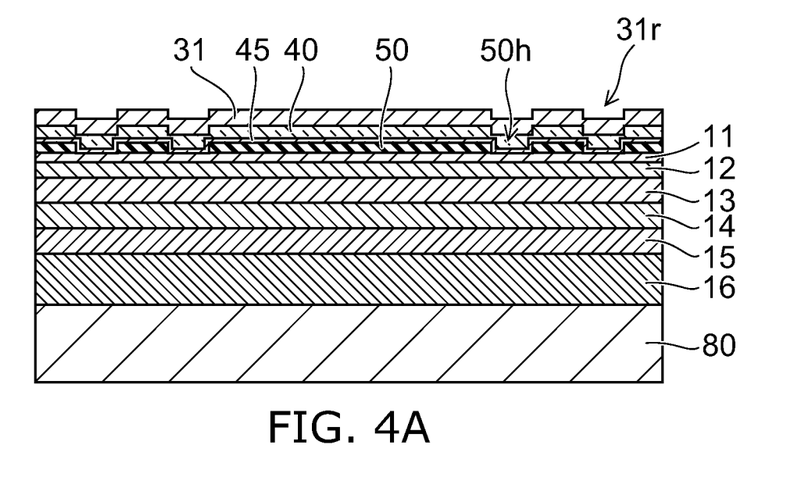
Figure 4B:
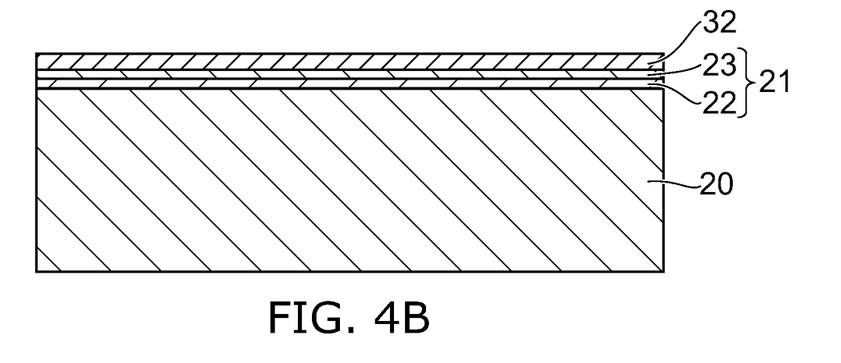

FIGS. 4A and 4B are schematic cross-sectional views of main components showing manufacturing processes of the light emitting element. FIG. 4A is a view of manufacturing processes that include the growth processes of the semiconductor stacked body; and FIG. 4B is a view of manufacturing processes in which the reflective film is formed on the support substrate with the diffusion prevention layer interposed.

First, as shown in FIG. 4A, the current diffusion layer 16, the clad layer 15, the light emitting layer 14, the clad layer 13, the current diffusion layer 12, and the contact layer 11 are epitaxially grown substantially in this order on a semiconductor substrate 80 such as GaAs, etc., by MOCVD (Metal Organic Chemical Vapor Deposition). Thereby, the semiconductor stacked body 10 including the light emitting layer 14 is formed on the semiconductor substrate 80.

Continuing, the current-blocking layer 50 in which at least one slit 50$h$ is made selectively is formed on the semiconductor substrate 80. The slit 50$h$ is made by photolithography. The slit 50$h$ is selectively made at the periphery of the position of the second upper electrode unit 62 that is formed in a subsequent process as viewed from a direction perpendicular to the major surface of the semiconductor stacked body 10.

Then, the transparent conductive layer 40 is formed on the current-blocking layer 50. The transparent conductive layer 40 and the contact layer 11 are connected to each other via the slit 50h. To increase the conductivity of the transparent conductive layer 40, annealing of the transparent conductive layer 40 may be performed.

Here, selective etching of the oxide film prior to forming the current-blocking layer 50 having the slit 50h is performed; and the transparent conductive layer 40 is formed after cleaning with a chemical liquid. Further, the intermediate layer 45 that is oxygen-rich is formed with a thickness of not more than 10 nm between the transparent conductive layer 40 and the semiconductor stacked body 10 by performing a series of processing to stabilize the transparent conductive layer 40 such as performing heat treatment of the transparent conductive layer 40 at not less than 400° C.

Continuing, the first light reflecting layer unit 31 is formed on the transparent conductive layer 40. The bottom surface of the slit 50h and the front surface of the current-blocking layer 50 are covered with the transparent conductive layer 40 and the first light reflecting layer unit 31 having uniform thicknesses. Therefore, a recess 31r is made in the first light reflecting layer unit 31 on the slit 50h.

On the other hand, as shown in FIG. 4B, the metal film 22 and the metal film 23 are stacked in this order on the support substrate 20. Thereby, the diffusion prevention layer 21 is formed on the support substrate 20. Further, the second light reflecting layer unit 32 is formed on the diffusion prevention layer 21.

The manufacturing processes shown in FIG. 4A and the manufacturing processes shown in FIG. 4B may progress simultaneously; or the manufacturing processes shown in FIG. 4B may progress prior to the manufacturing processes shown in FIG. 4A. Or, the manufacturing processes shown in FIG. 4B may progress after the manufacturing processes shown in FIG. 4A.

Figure 5A:
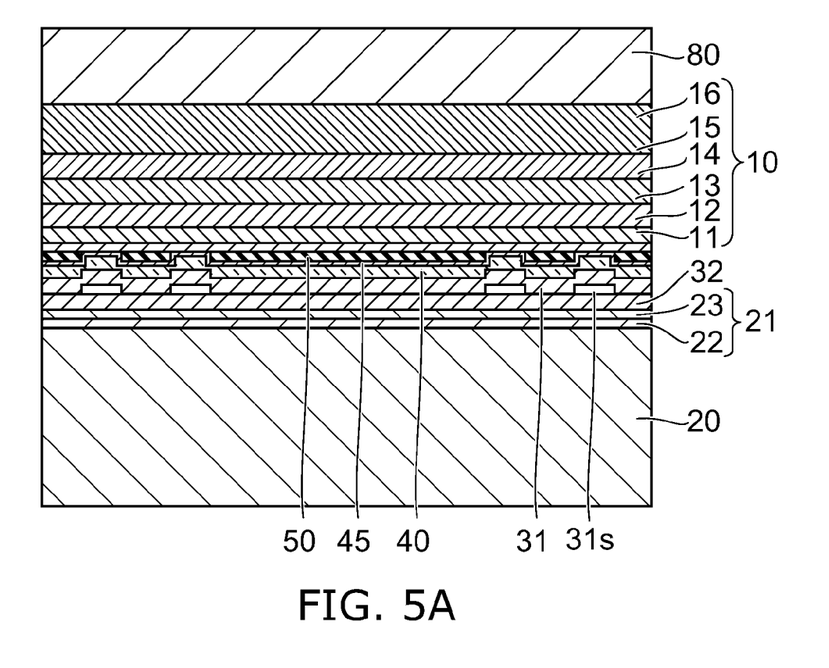
Figure 5B:
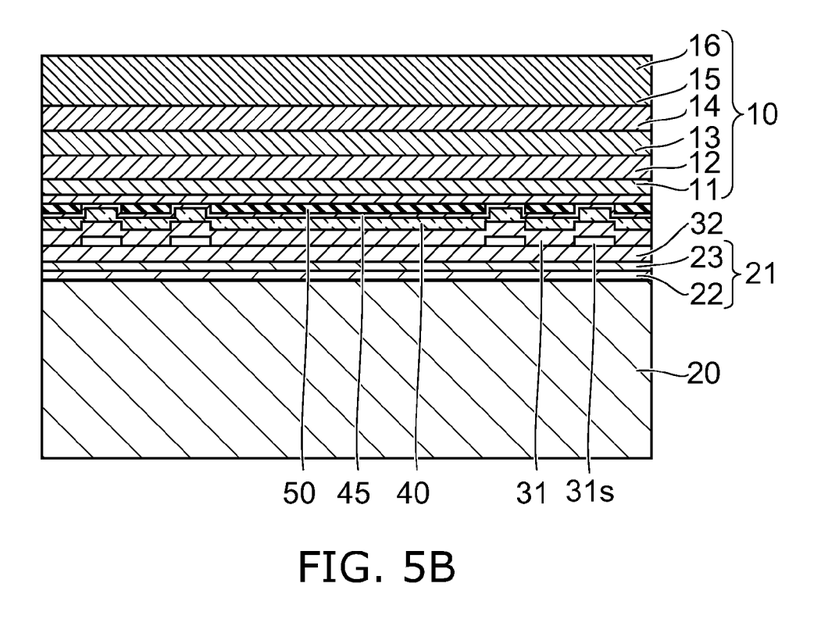

FIGS. 5A and 5B are schematic cross-sectional views of the main components showing manufacturing processes of the light emitting element. FIG. 5A is a view of manufacturing processes in which the first light reflecting layer unit and the second light reflecting layer unit are bonded to each other; and FIG. 5B is a view of manufacturing processes in which the semiconductor substrate is removed.

As shown in FIG. 5A, the first light reflecting layer unit 31 and the second light reflecting layer unit 32 are caused to oppose each other and are bonded to each other. Thereby, the light reflecting layer 30 is formed. The recess 31r described above is closed by the second light reflecting layer unit 32 being used as a lid to define the space 31s in the light reflecting layer 30.

Then, as shown in FIG. 5B, the semiconductor substrate 80 is removed from the semiconductor stacked body 10. The semiconductor substrate 80 is removed by, for example, wet etching.

Subsequently, as shown in FIG. 1, the first upper electrode unit 61 is directly formed on the semiconductor stacked body 10. Further, at least one second upper electrode unit 62 is formed on the semiconductor stacked body 10 with the contact layer 63 interposed. The first upper electrode unit 61 or the second upper electrode unit 62 is formed selectively on the semiconductor stacked body 10 by, for example, photolithography, sputtering film formation, etc. The second upper electrode unit 62 is connected to the first upper electrode unit 61 and has a configuration drawn out from the first upper electrode unit 61. The order of the processes that form the first upper electrode unit 61 and the second upper electrode unit 62 is arbitrary.

Second Embodiment

Figure 6:
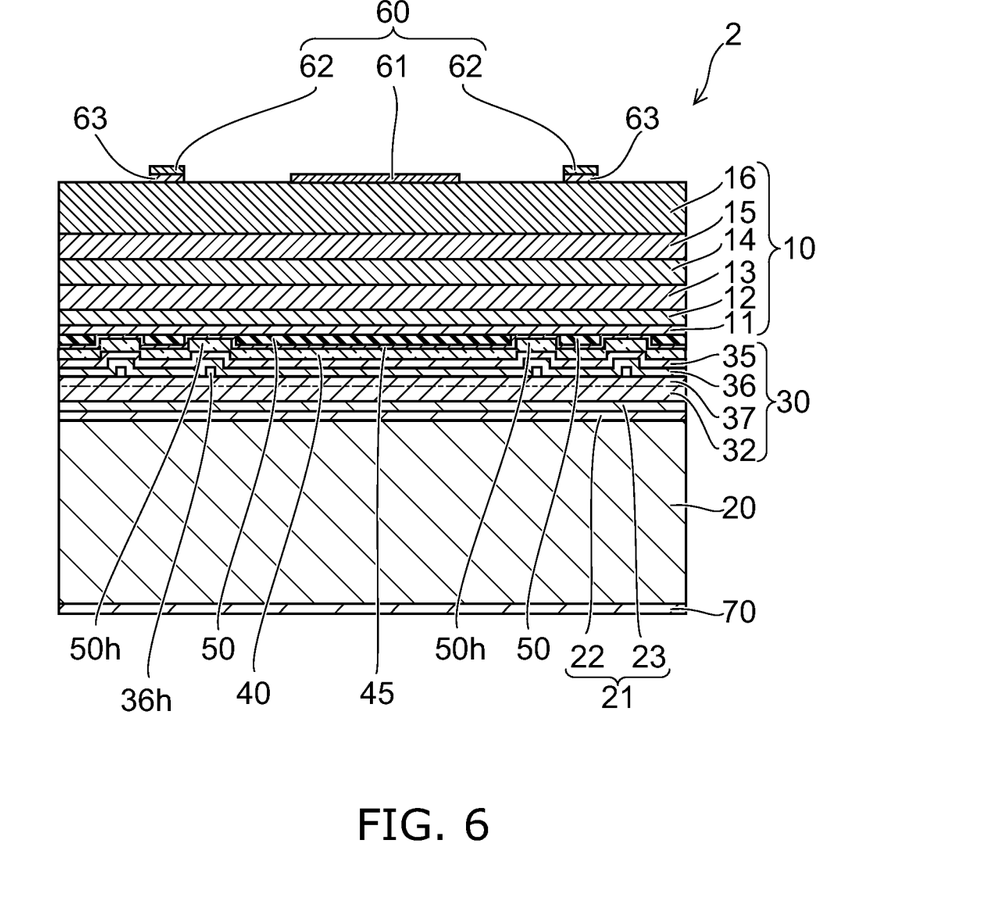
FIG. 6 is a schematic cross-sectional view of main components of a light emitting element according to a second embodiment.

FIG. 6 is a schematic cross-sectional view of main components of a light emitting element according to a second embodiment.

FIG. 6 corresponds to the X-X' cross section of FIG. 2.

In the light emitting element 2 according to the second embodiment, the material of a first light reflecting layer unit 35 is different from the material of the first light reflecting layer unit 31 of the light emitting element 1.

For example, the first light reflecting layer unit 35 is silver (Ag) or a silver (Ag) alloy, where the silver alloy includes at least one element selected from the group consisting of gold (Au), aluminum (Al), zinc (Zn), zirconium (Zr), silicon (Si), germanium (Ge), platinum (Pt), rhodium (Rh), nickel (Ni), palladium (Pd), copper (Cu), tin (Sn), carbon (C), magnesium (Mg), chrome (Cr), tellurium (Te), selenium (Se), titanium (Ti), oxygen (O), hydrogen (H), tungsten (W), and molybdenum (Mo).

The light emitting element 2 further includes a barrier layer 36 provided between the first light reflecting layer unit 35 and the second light reflecting layer unit 32. The barrier layer 36 includes at least one element selected from the group consisting of nickel (Ni), platinum (Pt), and titanium (Ti).

The light emitting element 2 further includes a bonding layer 37 including gold (Au) provided between the barrier layer 36 and the second light reflecting layer unit 32.

In the light emitting element 2, the bonding layer 37 and the second light reflecting layer unit 32 are bonded to each other to provide the light reflecting layer 30 that includes the first light reflecting layer unit 35, the barrier layer 36, the bonding layer 37, and the second light reflecting layer unit 32.

The light emitting element 2 also has effects similar to those of the light emitting element 1.

By using silver (Ag) or the silver (Ag) alloy as the material of the first light reflecting layer unit 35 in the light emitting element 2, the difference between the linear coefficients of thermal expansion of the semiconductor substrate 80 and the first light reflecting layer unit 35 is less than that of the light emitting element 1. Therefore, the warp and breakage of the semiconductor substrate 80 in the manufacturing processes is suppressed.

Also, the silver (Ag) covering film has a higher reflectance than the gold (Au) covering film at light wavelengths of 600 nm or less. Thereby, the light reflecting layer 30 of the light emitting element 2 has a higher reflectance than the light reflecting layer 30 of the light emitting element 1 even in the case where the light emitting layer 14 emits light of a wavelength that is shorter than red.

Third Embodiment

Figure 7:
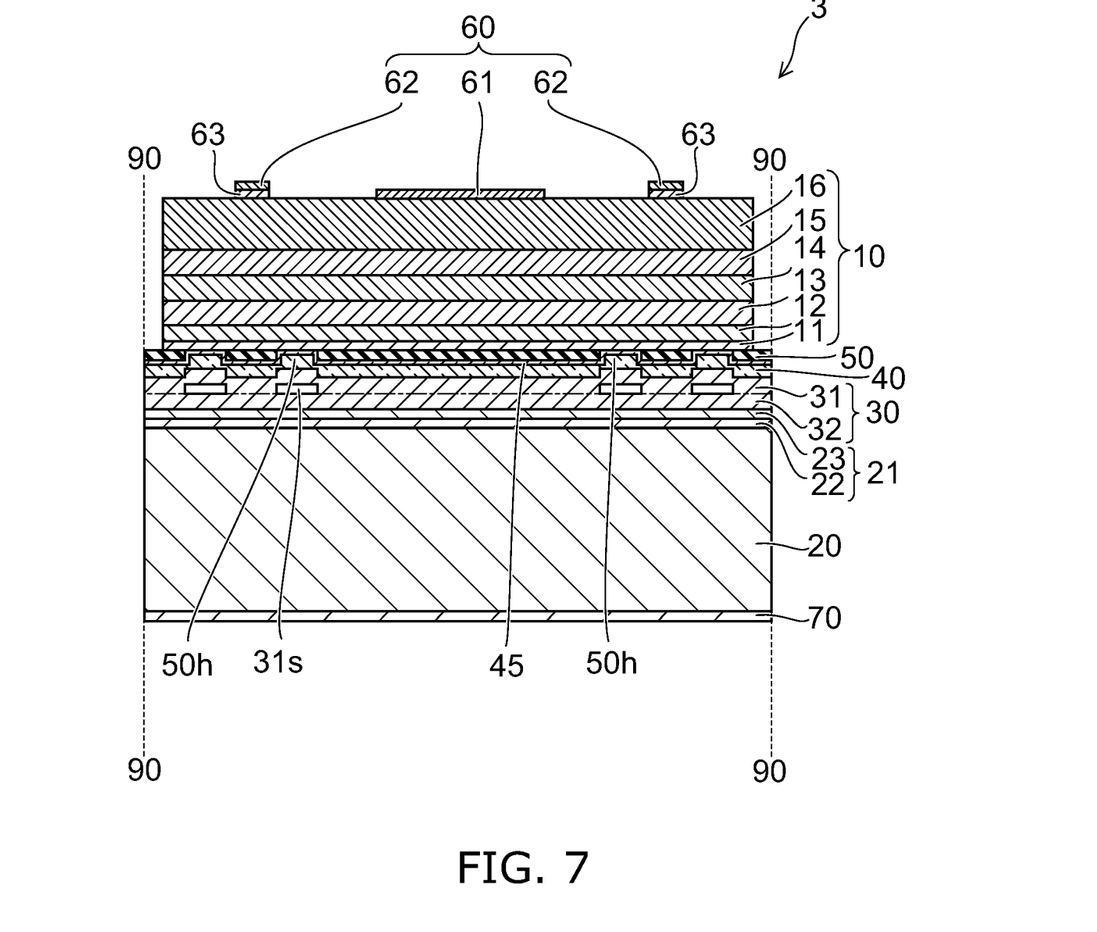
FIG. 7 is a schematic cross-sectional view of main components of a light emitting element according to a third embodiment.

FIG. 7 is a schematic cross-sectional view of main components of a light emitting element according to a third embodiment.

FIG. 7 corresponds to the X-X' cross section of FIG. 2.

In the light emitting element 3 according to the third embodiment, the surface area of the semiconductor stacked body 10 is less than the surface area of the support substrate 20 as viewed from the direction perpendicular to the first major surface of the light emitting layer 14.

The diffusion prevention layer 21, the light reflecting layer 30, the transparent conductive layer 40, and the current-blocking layer 50, which have surface areas substantially equal to the surface area of the support substrate 20, are provided on the support substrate 20.

The light emitting element 3 is singulated as shown in FIG. 7 by being cut along a dicing line 90. In the case where the dicing blade contacts the semiconductor stacked body 10 during the dicing, there is a possibility that a fracture layer may form inside the semiconductor stacked body 10. If such a fracture layer forms inside the semiconductor stacked body 10, there is a possibility that the life of the light emitting element may shorten due to the effects of the strain of the fracture layer.

In the light emitting element 3, the side surface of the semiconductor stacked body 10 is positioned inward from the dicing line 90. Thereby, the dicing blade does not easily contact the semiconductor stacked body 10. As a result, the fracture layer is not formed easily inside the semiconductor stacked body 10. Accordingly, the life of the light emitting element 3 is even longer than that of the light emitting element 1.

Fourth Embodiment

Figure 8:
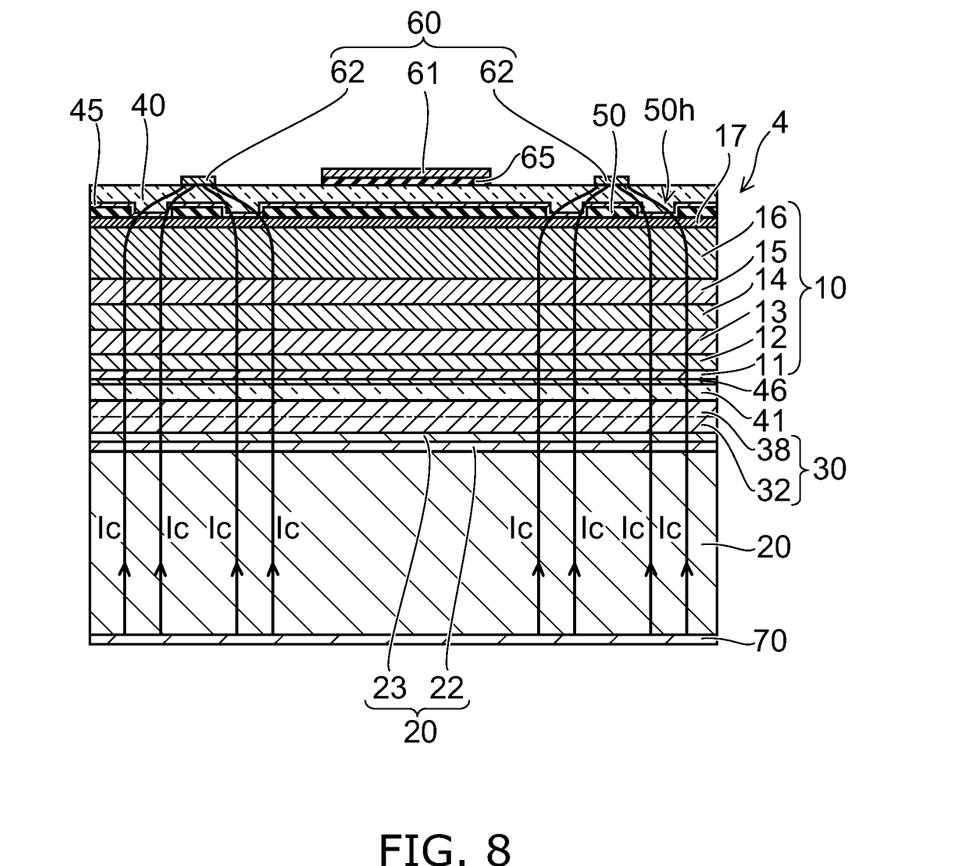
FIG. 8 is a schematic cross-sectional view of main components of a light emitting element according to a fourth embodiment.

FIG. 8 is a schematic cross-sectional view of main components of a light emitting element according to a fourth embodiment.

FIG. 8 corresponds to the X-X' cross section of FIG. 2.

In the light emitting element 4 according to the fourth embodiment, the current-blocking layer 50 in which the slit 50h is selectively provided is provided on the semiconductor stacked body 10. In other words, the current-blocking layer 50 is provided between the upper electrode 60 and the semiconductor stacked body 10 on the first major surface side of the light emitting layer 14.

In the light emitting element 4, the contact layer 17 is provided on the current diffusion layer 16. The current-blocking layer 50 having the slit 50h is provided on the contact layer 17. The transparent conductive layer 40 is provided on the current-blocking layer 50. An electrical connection is made between the transparent conductive layer 40 and the contact layer 17 via the slit 50h.

An insulating layer 65 is interposed between the transparent conductive layer 40 and the first upper electrode unit 61 of the upper electrode 60. Accordingly, there is no electrical connection between the first upper electrode unit 61 and the transparent conductive layer 40. On the other hand, the second upper electrode unit 62 of the upper electrode 60 contacts the transparent conductive layer 40. Accordingly, there is an electrical connection between the second upper electrode unit 61 and the transparent conductive layer 40.

In the light emitting element 4, the second light reflecting layer unit 32 and a first light reflecting layer unit 38 are bonded to each other. A transparent conductive layer 41 is interposed between the first light reflecting layer unit 38 and the semiconductor stacked body 10. An intermediate layer 46 having the same components as the intermediate layer 45 is interposed between the transparent conductive layer 41 and the contact layer 11.

Even in such a structure, when a voltage is applied between the first upper electrode unit 61 and the lower electrode 70, the current Ic does not flow between the first upper electrode unit 61 and the lower electrode 70 but flows through the slit 50h between the lower electrode 70 and the second upper electrode unit 62 that extends in the plane of the semiconductor stacked body 10.

The slit 50h is provided at the periphery of the second upper electrode unit 62 but not directly under the second upper electrode unit 62. Therefore, the current Ic flowing inside the light emitting element 4 is diffused as in the arrows Ic. Accordingly, localized current concentration such as that of the light emitting element 100 does not occur easily in the light emitting element 4. Further, the current density flowing through the slit 50h increases. Accordingly, in the light emitting element 4, the current Ic which has a high density is efficiently dispersed; and a luminance that is higher than that of the light emitting element 100 is obtained.

Hereinabove, exemplary embodiments are described with reference to specific examples. However, the embodiments are not limited to these specific examples. In other words, appropriate design modifications made by one skilled in the art to these specific examples also are within the scope of the embodiments to the extent that the features of the embodiments are included. For example, an insulating layer may be interposed between the first upper electrode unit 61 and the semiconductor stacked body 10. The components included in the specific examples described above and the dispositions, materials, conditions, configurations, sizes, etc., of the components are not limited to those illustrated and may be modified appropriately. For example, a structure in which the support substrate 20 is removed also is included in the light emitting elements 1 to 4.

The components included in the embodiments described above can be used in combinations within the extent of technical feasibility; and such combinations are within the scope of the embodiments to the extent that the features of the embodiments are included.

Furthermore, various modifications and alterations within the spirit of the embodiments will be readily apparent to those skilled in the art; and all such modifications and alterations should therefore be seen as within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting element, comprising:
   a semiconductor stacked body including a light emitting layer;
   a first upper electrode provided on the semiconductor stacked body, the first upper electrode being connected directly to the semiconductor stacked body;
   at least one second upper electrode extending from the first upper electrode on the semiconductor stacked body, the at least one second upper electrode being connected to the semiconductor stacked body via a first contact layer;
   a lower electrode provided under the semiconductor stacked body;
   a transparent conductive layer provided between the semiconductor stacked body and the lower electrode, the transparent conductive layer transmitting light emitted from the light emitting layer;
   an intermediate film containing oxygen provided between the semiconductor stacked body and the transparent conductive layer;
   a light reflecting layer provided between the transparent conductive layer and the lower electrode; and a current-blocking layer between the semiconductor stacked body and the transparent conductive layer or between the semiconductor stacked body and a pair of the first upper electrode and the second upper electrode, wherein at least one slit is provided selectively in the current-blocking layer as viewed from a direction perpendicular to a major surface of the light emitting layer.

2. The element according to claim 1, wherein, as viewed from the direction perpendicular to the major surface of the light emitting layer, the second upper electrode includes a first electrode unit extending from the first upper electrode toward a peripheral portion of a plane of the semiconductor stacked body, and a second electrode unit connected to the first electrode unit to extend substantially parallel to an outer circumference of the plane.

3. The element according to claim 1, wherein the slit is provided selectively at a periphery of the second electrode unit.

4. The element according to claim 1, wherein a support substrate is further provided between the lower electrode and the light reflecting layer.

5. The element according to claim 1, wherein a refractive index of the current-blocking layer is lower than a refractive index of the semiconductor stacked body at a wavelength of the light emitted from the light emitting layer.

6. The element according to claim 1, wherein the slit is not provided directly under at least one selected from the first upper electrode and the second upper electrode.

7. The element according to claim 1, wherein a distance between the second electrode unit and the slit is not less than 10 μm as viewed from the direction perpendicular to the major surface of the light emitting layer.

8. The element according to claim 1, wherein the surface area of a square defined by the length of one side of the square being a width of the slit as viewed from the direction perpendicular to the major surface of the light emitting layer is not more than 1000 μm$^2$.

9. The element according to claim 1, wherein a thickness of the current-blocking layer is not more than 100 nm.

10. The element according to claim 1, wherein a refractive index of the transparent conductive layer is lower than a refractive index of the semiconductor stacked body at a wavelength of the light emitted from the light emitting layer.

11. The element according to claim 1, wherein a total surface area A (cm$^2$) of the transparent conductive layer contacting the semiconductor stacked body via the slit is not less than 5% of a surface area of the semiconductor stacked body and not more than 15% of the surface area of the semiconductor stacked body when viewed from the direction perpendicular to the major surface of the light emitting layer.

12. The element according to claim 1, wherein a thickness of the transparent conductive layer is not less than 30 nm and not more than 100 nm.

13. The element according to claim 4, wherein the light reflecting layer includes a first light reflecting layer and a second light reflecting layer unit, the first light reflecting layer unit is bonded to the second light reflecting layer unit, the first light reflecting layer unit being provided on the semiconductor stacked body side, the second light reflecting layer unit being provided on the support substrate side.

14. The element according to claim 13, further comprising a barrier layer provided between the first light reflecting layer unit and the second light reflecting layer unit,
the barrier layer including at least one element selected from the group consisting of nickel (Ni), platinum (Pt), and titanium (Ti).

15. The element according to claim 14, further comprising a bonding layer including gold (Au) between the barrier layer and the second light reflecting layer unit.

16. The element according to claim 4, wherein the support substrate is a conductive substrate.

17. The element according to claim 1, wherein a space is made in the light reflecting layer under the slit.

18. The element according to claim 4, wherein a surface area of the semiconductor stacked body is less than a surface area of the support substrate as viewed from the direction perpendicular to the major surface of the light emitting layer.

* * * * *